US009075107B2

(12) United States Patent
Petersen (10) Patent No.: US 9,075,107 B2
(45) Date of Patent: Jul. 7, 2015

(54) METHOD FOR SHEET RESISTANCE AND LEAKAGE CURRENT DENSITY MEASUREMENTS ON SHALLOW SEMICONDUCTOR IMPLANTS

(75) Inventor: Christian L. Petersen, Burnaby (CA)

(73) Assignee: Capres, Lyngby (DK)

( * ) Notice: Subject to any disclaimer, the term of this patent is extended or adjusted under 35 U.S.C. 154(b) by 2022 days.

(21) Appl. No.: 12/298,387

(22) PCT Filed: Apr. 24, 2007
(Under 37 CFR 1.47)

(86) PCT No.: PCT/DK2007/000192
§ 371 (c)(1),
(2), (4) Date: Aug. 24, 2009

(87) PCT Pub. No.: WO2007/121752
PCT Pub. Date: Nov. 1, 2007

(65) Prior Publication Data
US 2011/0320144 A1 Dec. 29, 2011
US 2012/0143545 A9 Jun. 7, 2012

Related U.S. Application Data (60) Provisional application No. 60/745,470, filed on Apr. 24, 2006.

(51) Int. Cl.
G01R 31/20 (2006.01)
G01R 31/312 (2006.01)
G01R 31/26 (2014.01)

(52) U.S. Cl.
CPC .......... *G01R 31/312* (2013.01); *G01R 31/2648* (2013.01)

(58) Field of Classification Search
None
See application file for complete search history.

(56) References Cited

U.S. PATENT DOCUMENTS

| 4,703,252 | A | 10/1987 | Perloff et al. |
| 5,691,648 | A | 11/1997 | Cheng |
| 6,154,041 | A * | 11/2000 | Cheng ..................... 324/762.05 |
| 6,842,029 | B2 | 1/2005 | Howland |
| 7,030,633 | B1 * | 4/2006 | Qiu et al. ..................... 324/719 |
| 7,078,919 | B2 | 7/2006 | Prussin |

(Continued)

FOREIGN PATENT DOCUMENTS

WO    WO 2005/022135    3/2005

OTHER PUBLICATIONS

Keller S. et al.; "Microscopic Four-Point Probe Based on SU-8 Cantilevers"; Review of Scientific Instruments; Dec. 14, 2005; pp. 125102-1 to 125102-4; American Institute of Physics, US; XP012079131; ISSN: 0034-6748.

(Continued)

*Primary Examiner* — Minh N Tang
(74) *Attorney, Agent, or Firm* — Klein, O'Neill & Singh, LLP (57) ABSTRACT

A method for accurately determining the sheet resistance and leakage current density of a shallow implant in a semiconductor substrate surface includes making one or more four-point resistance measurements with an induced current below 100 μA on the semiconductor surface with a plurality of electrode spacing sets, at least one set defining an electrode separation distance less than 100 μm. The sheet resistance and implant leakage are determined through fitting the measured data to theoretical data to within a predetermined error margin.

18 Claims, 5 Drawing Sheets

(56) References Cited

U.S. PATENT DOCUMENTS

2002/0153909 A1 10/2002 Petersen et al.
2004/0056674 A1 3/2004 Petersen et al.

OTHER PUBLICATIONS

Kinder R. et al.; "Determination of the Depth of Shallow Implanated P+-N Junctions by the Four-Point Probe Method"; Physica Status Solidi (A); 1996; pp. 393-398; vol. 157; Applied Research, Berlin, Germany; XP009042017; ISSN: 0031-8965.

Smits F. M. "Measurement of Sheet Resistives with the Four-Point Probe"; Bell System Technical Journal; 1958; pp. 711-718; AT&T, Short Hills, New York, US; XI009033160; ISSN: 0005-8580.

* cited by examiner

Fig. 5

METHOD FOR SHEET RESISTANCE AND LEAKAGE CURRENT DENSITY MEASUREMENTS ON SHALLOW SEMICONDUCTOR IMPLANTS

CROSS-REFERENCE TO RELATED APPLICATION

This application is a national phase filing, under 35 U.S.C. §371(c), of International Application No. PCT/DK2007/000192, filed Apr. 24, 2007, the disclosure of which is incorporated herein by reference in its entirety.

FEDERAL SPONSORED RESEARCH OR DEVELOPMENT

Not Applicable

BACKGROUND OF THE INVENTION

The present invention generally relates to methods for obtaining an electrical property of a test sample. The present invention relates to the measurement of sheet resistance and probe current leakage on shallow implanted regions in a semiconductor surface, and more particularly to the accurate and non-destructive measurement of sheet resistance on ultra shallow junctions.

A method for accurately determining the sheet resistance and leakage current density of a shallow implant in a semiconductor surface includes making one or more four-point resistance measurements with an induced current below 100 μA on the semiconductor surface with a plurality of electrode spacing sets, at least one set having an average spacing below 100 μm. The sheet resistance and implant leakage current density are determined through fitting the measured data to theoretical data to within a predetermined error.

Alternatively, the sheet resistance and implant leakage may be determined through fitting the measured data to theoretical data so as to obtain a minimal error, e.g. minimizing the error using numerical or other methods.

Related methods and techniques may be found in patent publications such as U.S. Pat. No. 4,703,252, U.S. Pat. No. 6,842,029, U.S. Pat. No. 7,078,919 and WO 2005/022135. Reference is made to the above US patent publications, all of which are hereby incorporated in the present specification by reference in their entirety for all purposes.

A transistor in a semiconductor circuit consists of two implanted regions, called the source and drain, connected electrically by a channel under a gate electrode. The Source Drain Extension (SDE) is a shallow implant that interfaces the channel under the gate with the deep source and drain. As transistors are made smaller, the SDE must be made extremely shallow to create a high performance device, as SDE depth is a key factor in transistor performance, especially fast switching speeds and low power requirements. At the 100 nm device technology node, depths of 20-30 nm are required, and future technology will need even shallower junctions. The term Ultra-Shallow Junction (USJ) refers to this extremely thin SDE.

Historically, macroscopic four-point probes have been the accepted way to measure the active dose in implanted surfaces. A macroscopic four-point probe is typically a millimeter-sized device with four spring-loaded transition metal needles in a single row. When the needles press against a surface, a current driven through the outer two pins generates a detectable voltage across the inner pins. This four-point measurement technique has been the standard way to measure sheet resistance on semiconductors for many years. However, macroscopic four-point probes perform poorly on the advanced ultra-thin films of today, as the spring-loaded needles tend to create surface damage and film penetration. The macroscopic probes also require large homogenous areas for measurements without edge artifacts. These limitations are particularly problematic on ultra shallow junctions. Several new technologies have appeared to address the issues with the conventional probes. These include macroscopic probes with low contact force and capacitive non-contact probes. These probing technologies address the destructive nature of conventional probing but fail to address the dimensional aspect of measurements on ultra shallow junctions: Macroscopic probes will consistently report too low USJ sheet resistance values, especially on high resistance implants with high leakage. Larger probe spacing will lead to larger deviations. While soft-touch or non-contact versions of the macroscopic probes solve issues with punch-through and surface damage, they tend to be even larger than the conventional probes, and thus suffer even more from this length scale problem.

SUMMARY OF THE DISCLOSURE

Micro-scale measurements are needed to accurately determine the actual sheet resistance over the full range of USJ implant depths. The small dimensions and ultra-low contact force of microscopic probes make it possible to do non-destructive USJ implant characterizations in an area smaller than a typical bonding pad, thus providing for the first time a viable method for USJ sheet resistance characterization on patterned (product) wafers. The present invention addresses the shortcomings of the conventional technologies by using microscopic four-point probes to determine the sheet resistance of ultra-shallow junctions.

The present invention takes advantage of the fact that sheet resistance measurements in a two-layer system will vary with the length scale at which they are performed. At the limit of very small electrode spacing, the measurement will reflect only transport in the top layer, irrespective of the bottom layer condition. At large electrode spacing, the measured resistance will be the parallel combination of the two layers. The length scale separating these two regimes depends on the resistance area product of the interface in between the layers and the sheet resistance of the layers. For Ultra Shallow Junctions this length scale is on the order of 1000 μm or more.

By measuring surface sheet resistance on a semiconductor wafer with a shallow implanted region at a set of different probe spacings it is possible to determine the actual sheet resistance of the shallow implanted region.

A first aspect of the present invention relates to a method for determine an electrical property of a shallow implant which may comprise the steps of:

providing a multi-point probe having four electrical conductive electrodes, two of the electrical conductive electrodes having an electrode spacing of less than 100 μm, positioning the four electrical contact points of the multi-point probe in contact with an area of the shallow implant, performing a four point measurement by inducing a current of less than 100 μA in the test sample via the multi-point probe, extracting the electrical property based on a mathematical relation between the four-point resistance measurement and electrode spacing between the four electrical conductive electrodes.

The multi-point probe may comprise more than the above mentioned four electrodes, e.g. five, six, eight, ten or even more electrodes. The multi-point probe may e.g. be of a kind with a base and a plurality of cantilever arms extending parallel from the body. Such multi-point probes are e.g. described in US 2004/0056674 and/or US 2002/0153909. Reference is made to the two US publications, both of which are hereby incorporated in the present specification by reference in their entirety for all purposes. See for instance the probe illustrated in FIG. 6 of US 2004/0056674 and the corresponding description.

The multi-point probe may be received in a system having positioning means for moving the probe relative to the test sample, e.g. using small actuators or the like. In one embodiment, the probe may be held in a movable holder, while the test sample may be held in a stationary holder. The electrical property mentioned in the first aspect of the present invention may be sheet resistance or current leakage density.

The four-point measurement may be performed a number of times in succession. The electrical property may be calculated or extracted based on a plurality of measurements. The spacing between the electrodes may be determined e.g. by visual inspection using an optical microscope or a scanning tunnelling microscope or any other inspection method. Alternatively, the spacing may be known from production of the probe.

A second aspect of the present invention relates to a method for determining the sheet resistance and current leakage density of a shallow implant in the surface of a semiconductor substrate, the method may comprise:
  a. Performing one or more four-point resistance measurements on the semiconductor surface at a plurality of electrode spacing sets, the induced current in the four-point resistance measurements being below 100 and for at least one of the plurality of electrode spacing sets having an average electrode separation below 100 μm.
  b. Extracting sheet resistance of the shallow implant in the semiconductor surface based on a mathematical relation between the one or more four-point resistance measurements and the plurality of electrode spacing sets.

It is an advantage of the present invention that the method according to the first and/or second aspect may further comprise using a mathematical relation between the one or more four-point resistance measurements and the plurality of electrode spacing sets to extract the saturation leakage current density of the shallow implant in the semiconductor surface.

The mathematical or physical relation is described in more detail with reference to the drawings.

In a further embodiment of the present invention, at least one of the plurality of electrode spacing sets may have an average spacing above 300 μm. The electrode spacing is preferably known for all sets of the plurality of electrodes. The electrode spacing may be determined by inspection or e.g. known from production of the probe. In a still further embodiment of the present invention, at least one of the plurality of electrode spacing sets may have an average spacing below 20 μm, and the limiting behavior of theoretical data is used to determine the sheet resistance of the shallow implant, the limiting theoretical behavior being given by the following formula:

$$R\Big|_{s\to 0} = \frac{\log 2}{2\pi} R_t$$

where R is the measured four-point resistance, s is the four-point probe electrode spacing, and $R_t$ is the sheet resistance of the shallow implant.

In a particular embodiment of the present invention, the sheet resistance and saturation leakage current density of the shallow implant may be determined by adjusting the plurality of variables until the theoretical data fit the measured data within a predetermined error. The theoretical and measured data may be fitted by using the following formula:

$$R = \frac{R_t R_b}{R_t + R_b} \frac{1}{2\pi}\left(\frac{2R_t}{R_b}\left(K_0\left(\frac{s}{\lambda}\right) - K_0\left(\frac{2s}{\lambda}\right)\right) + \log 4\right)$$

where $\lambda = kT/(J_s q(R_t + R_b))$; $R_t$ and $R_b$ are the sheet resistance of the shallow implant and the semiconductor substrate, respectively, $K_0$ is the modified Bessel function of the second kind of order zero, s is the four-point probe electrode spacing, k is the Boltzmann constant, T is the temperature, $J_s$ is the saturation leakage current density, and q is the elementary charge.

The adjustment, or fitting, of the variables may e.g. be performed using a least-squares method or any other numerical method or numerical fitting or approximation.

In an even further embodiment of the present invention, the electrical resistivity, ρ, of the semiconductor substrate may be measured experimentally by Secondary Ion Mass Spectrometry, or any other method, and the substrate sheet resistance is determined by the relation $R_b = \rho/t$, t being the thickness of the semiconductor substrate.

The first aspect of the present invention may include any features of the second aspect of the present invention, and the second aspect of the present invention may include any features of the first aspect of the present invention.

A third aspect of the present invention relates to a system for measuring sheet resistance and saturation leakage current on a shallow implant in a semiconductor substrate, the system may comprise:
  a probe with a first plurality of electrodes for establishing electrical contact with the surface of the semiconductor substrate;
  a voltage controlled current source for inducing a current between a first pair of electrodes;
  a high-impedance electrometer for measuring a voltage difference between a second pair of selected electrodes;
  a multiplexer comprising a second plurality of electrical connection lines, two of which are connected to the current source and another two of which are connected to the electrometer;
  a lock-in amplifier for generating a periodic reference signal controlling the voltage controlled current source, and for detecting the in-phase output of the high-impedance electrometer; and
  a computer system with a central processing unit and memory comprising a computer implementation of the method according to the first and/or second aspect of the present invention.

The probe may be of a kind as described in relation to the first and/or second aspect above.

The second pair of selected electrodes used for measuring the voltage difference as recited above is preferably different from the first pair of selected electrodes used for inducing a current.

In a presently preferred embodiment of the present invention, the first pair of electrodes and the second pair of electrodes do not include common electrodes.

In an even further embodiment of the present invention the first plurality may be four. Preferably the first plurality of electrodes is an even number, but may in alternative embodiments be constituted by a probe having an uneven number of electrodes.

The computer implementation of the method may include any of the features of the first and/or second aspect of the present invention.

The measuring method is performed when the electrodes are in electrical contact with the semiconductor substrate. The apparatus may include moving means for positioning the probe into contact with the surface of the semiconductor substrate.

The computer system may further comprise communication means and/or output means for transmitting and/or outputting the result of the measurement. Examples could be a network connection, a printer, a screen, a hard disk, a flash drive or any other means for receiving the result of the measurement.

The system according to the third aspect of the present invention may be adapted to perform any of the steps mentioned in relation to the first and/or second aspect of the present invention.

BRIEF DESCRIPTION OF THE DRAWINGS

The present invention is now to be described in greater detail with reference to the figures, in which.

DETAILED DESCRIPTION

Figure 1:
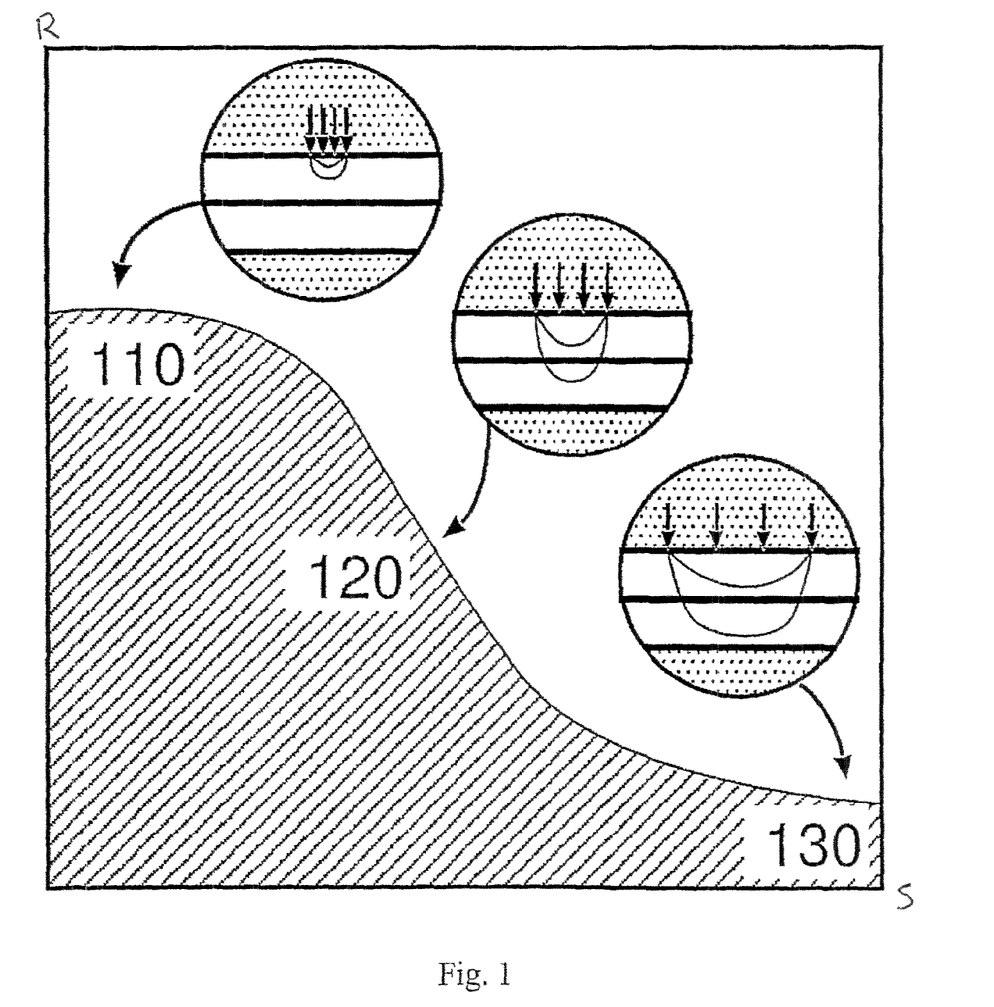
FIG. 1 is a graph of the length scale dependence of measured sheet resistance on a two-layer system.

FIG. 1 illustrates how surface sheet resistance measurements on a two-layer system will vary with the length scale at which they are performed. At the limit of very small electrode spacing, 110, the measurement will reflect only transport in the top layer, irrespective of the bottom layer condition. At large electrode spacing, 130, the measured resistance will be the parallel combination of the two layers. At an intermediate length scale, 120, the measured sheet resistance will lie in between the two limiting cases. The length scale separating these two limiting regimes depends on the resistance area product of the interface in between the layers and the sheet resistance of the layers.

To determine this length scale, we consider a simple sandwich of two thin infinite layers with sheet resistance $R_t$ (top) and $R_b$ (bottom). A four-point resistance measurement performed on the top surface with a very small probe will only detect the top layer, and the measured four-point resistance is given by $$R = \frac{\log 2}{2\pi} R_t \qquad (1)$$

On the other hand, if the measurement is done with a very large probe, the result will be a parallel combination of the two layers:

$$R = \frac{\log 2}{2\pi} \frac{R_t R_b}{R_t + R_b} \qquad (2)$$

Figure 2:
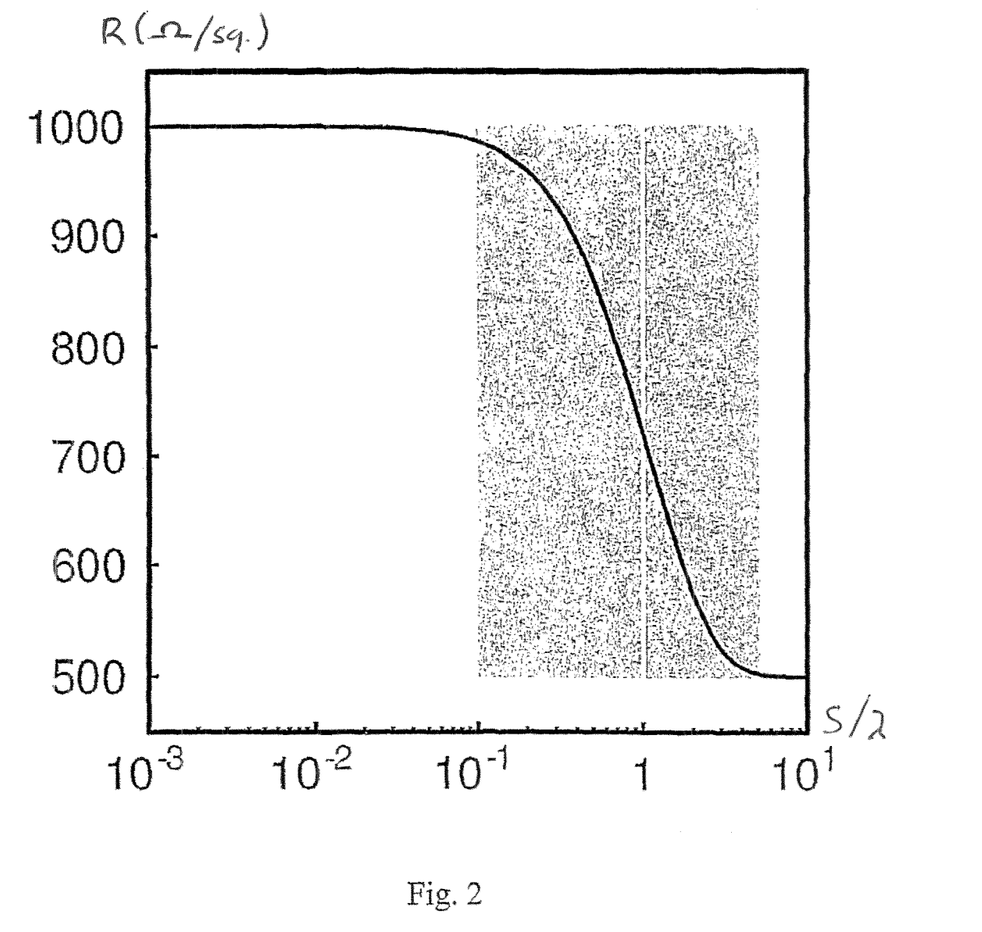
FIG. 2 is a graph of the expected variation of measured sheet resistance with probe spacing, the shaded area indicating the transitional regime between the single sheet and parallel sheets limits.

At a certain transition length scale the measured resistance will lie in between the values of Eq. 1 and Eq. 2. The length scale is determined by the resistance area product, RA, of the interface between the two layers, and is expressed by:

$$\lambda = \sqrt{\frac{RA}{R_t + R_b}} \qquad (3)$$

and the four-point resistance for a probe with pin spacing s is then:

$$R = \frac{R_t R_b}{R_t + R_b} \frac{1}{2\pi} \left( \frac{2 R_t}{R_b} \left( K_0\left(\frac{s}{\lambda}\right) - K_0\left(\frac{2s}{\lambda}\right) \right) + \log 4 \right) \qquad (4)$$

where $K_0$ is the modified Bessel function of the second kind of order zero. This behaviour is shown in FIG. 2 for an example system with $R_t=R_b=1000$ Ω/sq. It is apparent that a transition occurs at $s=\lambda$, and that there is a transitional region from $0.1\lambda$ to $5\lambda$, indicated by a shaded area on the figure, where the measured resistance differs significantly from the limits in Eq. 1 and Eq. 2. In the case of a shallow implanted region in a semiconductor surface such as an ultra shallow junction, the interface is effectively a p-n type barrier with a strongly non-linear behavior. The current density through the barrier can be expressed $$J = J_s\left(\exp\left(\frac{qV}{kT}\right) - 1\right) \qquad (5)$$

where q is the elementary charge, T is the temperature, k is the Boltzmann factor, V is the potential across the interface and $J_s$ the saturation current density. If the potential across the interface is much smaller than the thermal voltage at T=300 K, kT/q=25, 9 mV, expression Eq. 5 reduces to $$J = \frac{V J_s q}{kT} \qquad (6)$$

This is a valid approximation on most implants when the four-point measurements are performed at a current setpoint of a few μA, leading to a potential drop on the order of a few mV between the inner electrodes (typical USJ sheet resistance lies in a narrow range of 500-2000 Ω/sq). The potential across the barrier will only be a fraction of this inner electrode potential. In this regime, the resistance-area product RA for the barrier is $$RA = \frac{kT}{J_s q} \qquad (7)$$

Let us consider a very large leakage current density of $10^{-3}$ A/cm², a high USJ sheet resistance $R_t$=2000 Ω/sq, and a highly resistive substrate $R_b$=500 Ω/sq. Eq. 3 then gives us a length scale of $\lambda$ 1020 μm. By the argument above, only four-point probe measurements performed on a length scale below 100 μm will therefore always generate accurate representations of USJ sheet resistance.

The above argument considers a system of two thin layers. This is a valid assumption on typical USJ implants, as they are implanted in a thin transistor halo region of significantly higher conductivity than the surrounding substrate. A system with a semi-infinite bottom layer has also been analyzed, and the conclusions drawn above hold true in this case as well.

Figure 3:
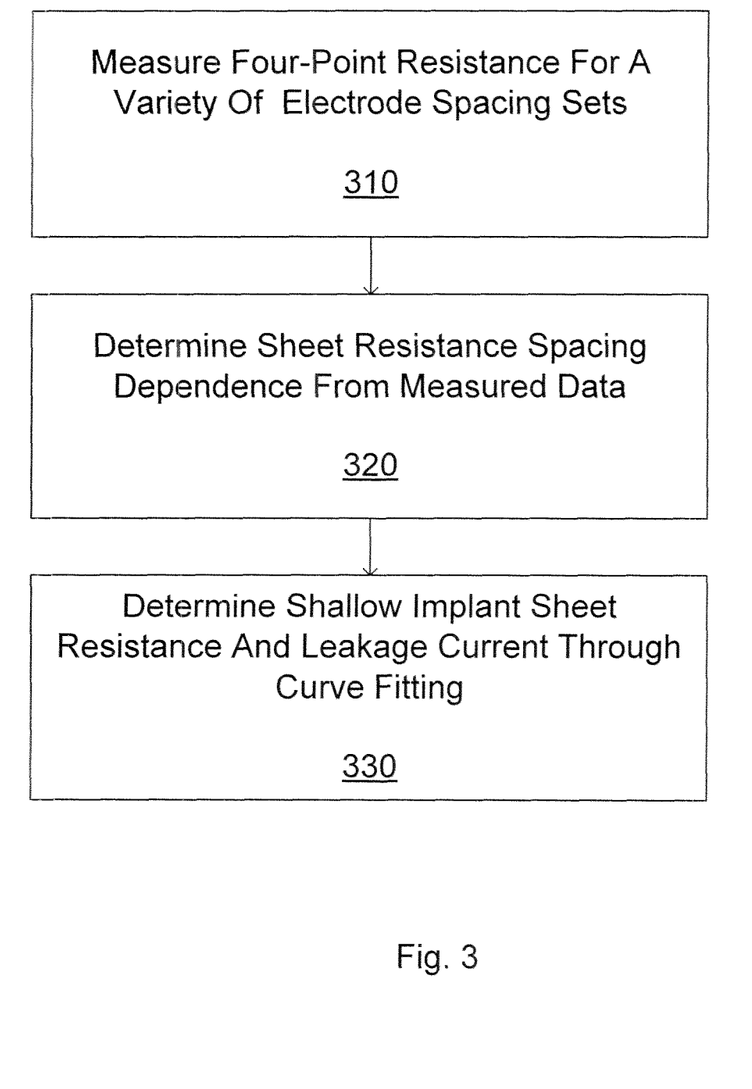
FIG. 3 is a method for accurately determining the sheet resistance of an ultra shallow junction by measuring four-point resistance repeatedly at different length scales.

In a preferred embodiment of the present invention, microscopic measurements are made at different length scale as illustrated on FIG. 3. A series of four-point measurements are performed on the sample surface with different electrode spacing, 310, at least one electrode spacing being below 100 μm. Next, the length scale dependence of the measurements is determined, 320. Finally, the ultra shallow junction sheet resistance and current leakage density is determined by fitting the measured data to the theoretical model in Eq. 4.

In a second preferred embodiment, a single four-point measurement is performed on the semiconductor surface with an electrode spacing less than 20 μm. The sheet resistance of the ultra shallow junction is then determined by the limiting behavior of Eq. 4 for small electrode spacing s:

$$R|_{s \to 0} = \frac{\log 2}{2\pi} R_t \quad (8)$$

Figure 4:
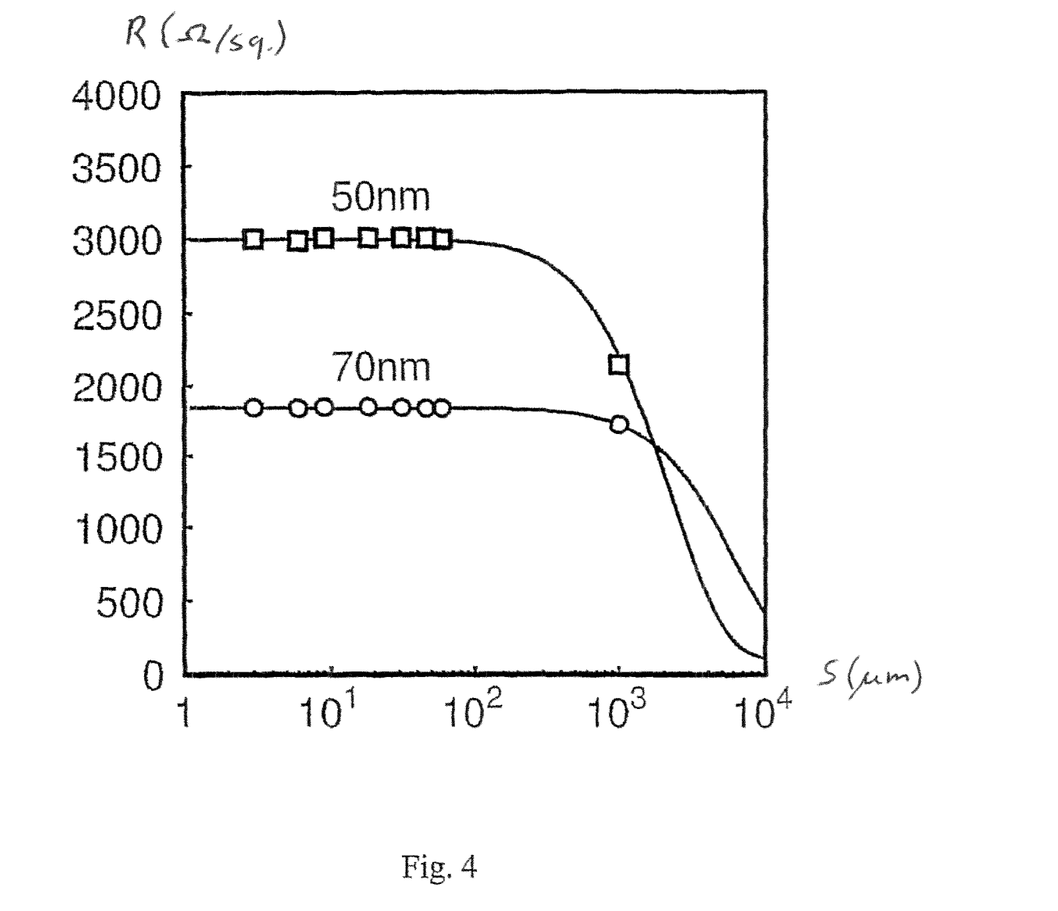
FIG. 4 shows example four-point measurements on an ultra shallow junction. The solid line is the predicted behavior according to the invention.

FIG. 4 shows measurements according to the invention on two semiconductor shallow implants with a depth of 50 nm (square bullets) and 70 nm (circle bullets) respectively.

The microscopic four-point probe measurements were performed using micro-fabricated probes at probe spacing ranging from 3 to 60 μm. The macroscopic measurement was performed with a conventional tungsten needle probe. The current setpoint was 50 μA. For both implants, the measured sheet resistance is essentially constant over the microscopic range, while the macroscopic measurement is significantly lower. This is expected from FIG. 1.

The bottom layer sheet resistance was $R_b$=15 Ω/sq. A fit of the data to Eq. 4 then leads to $R_t$=3006 Ω/sq and λ=1.92 mm for the 50 nm thick implant and $R_t$=1847 Ω/sq and λ=5.66 mm for the 70 nm implant. The fitted theoretical predictions are shown as solid lines in FIG. 4.

The saturation current density can be determined from the data in FIG. 4 by the relation:

$$J_s = \frac{kT}{q\lambda^2(R_t + R_b)} \quad (9)$$

This gives $J_s$=2.31×10$^{-4}$ A/cm$^2$ for the 50 nm implant and $J_s$=4.35×10$^{-5}$ A/cm$^2$ for the 70 nm implant.

Figure 5:
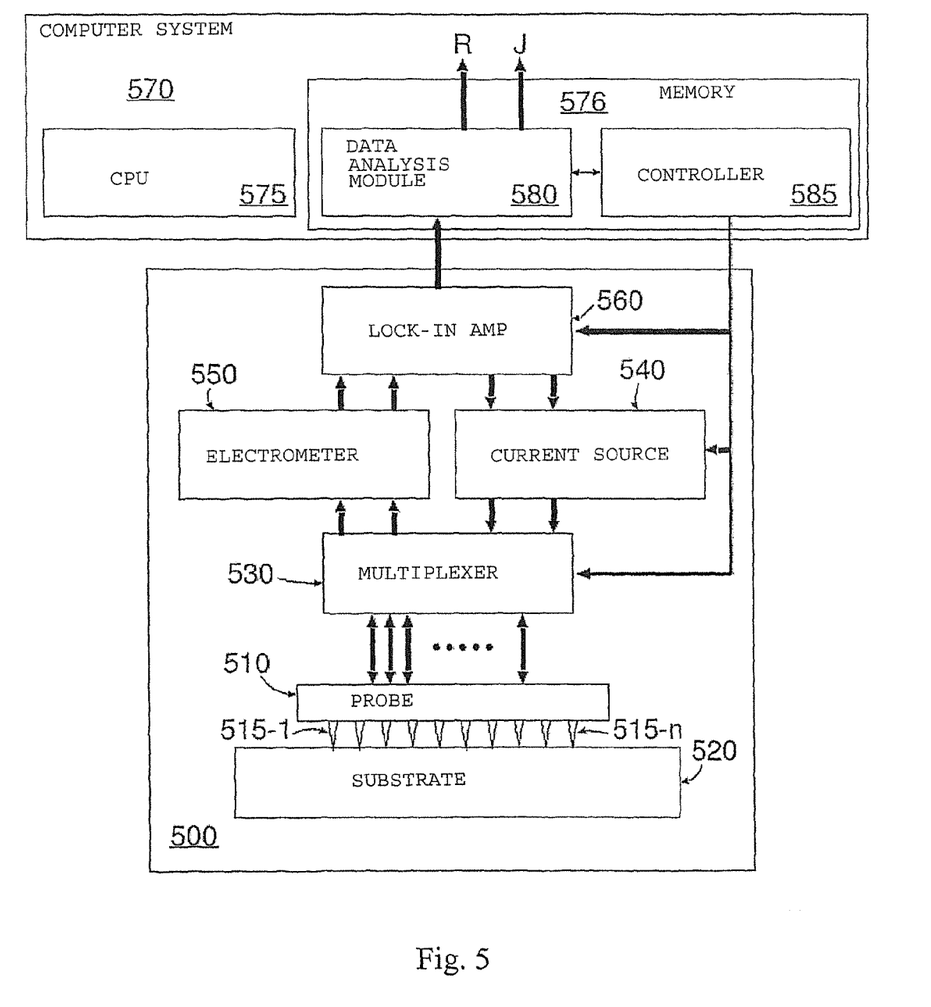
FIG. 5 is a block diagram of an apparatus for measuring the sheet resistance and saturation leakage current density according to one embodiment of the present invention.

FIG. 5 is a block diagram of an apparatus for measuring the sheet resistance and saturation leakage current density according to one embodiment of the present invention. The apparatus consists of a shallow junction test device 500 connected to a computer system 570.

The shallow junction test device 500 consists of a probe 510 with multiple electrodes, 515-1 to 515-n, n being the total number of electrodes, in contact with the surface of a semiconductor substrate 520 with a shallow implant.

In a preferred embodiment of the invention the probe electrodes are electrically conducting micro-fabricated cantilevers, and the spacing between adjacent electrodes is between 1 μm and 300 μm. In the preferred embodiment, at least one of the electrode spacing sets has an average electrode separation below 100 μm.

In another preferred embodiment, at least one of the electrode spacing sets has an average electrode separation above 300 μm.

The probe connects to a voltage controlled current source 540 for inducing a current between a pair of probe electrodes and a high-impedance electrometer 550 for measuring a voltage difference between another pair of probe electrodes. The probe electrodes connected to the electrometer and current source are selectable through an n-to-4 multiplexer 530 connected to each of the probe electrodes.

The current source is driven by an oscillatory reference signal from a lock-in amplifier 560, and the electrometer output connects to the lock-in amplifier input for detecting the in-phase component of the measured voltage with respect to the driven current.

The computer system 570 consists of a central processing unit 575 operating on a memory unit 576. The memory unit contains program instructions for a controller module 585 enabling making one or more four-point resistance measurements with a current set-point below 100 μA at a predetermined multiple of electrode spacing sets. The memory unit also contains program instructions for a data analysis module 580 that determines the sheet resistance of shallow implant by fitting the measured data to Eq. 4 to within a predetermined error, and determines the saturation leakage current density from evaluating Eq. 9.

The computer system 570 may of course comprise other elements, such as electrical power supply, IO devices etc.

FIG. 1 schematically illustrates the sheet resistance along the y-axis and probing length scale along the x-axis.

FIG. 2 schematically illustrates the sheet resistance [Ω/sq] along the y-axis and normalized probe spacing s/λ along the x-axis.

FIG. 3 schematically illustrates three steps in a method for accurately determining the sheet resistance of an ultra shallow junction. The method comprises the steps 310 Measure four-point resistance for a variety of electrode spacing sets. 320 Determine sheet resistance spacing dependence from measured data. 330 Determine shallow implant sheet resistance and leakage current through curve fitting.

FIG. 4 schematically illustrates the sheet resistance [Ω/sq] along the y-axis and probe length scale [μm] along the x-axis.

FIG. 5 schematically illustrates a block diagram of an apparatus for measuring the sheet resistance and saturation leakage current density. The apparatus comprises:

| | |
|---|---|
| 500: | Shallow junction test device |
| 510: | Probe |
| 515-1-515-n: | Probe arms. |
| 520: | Semiconductor substrate with shallow implant |
| 530: | Multiplexer |
| 540: | Voltage controlled current source |
| 550 | Electrometer |
| 560: | Lock-in amplifier. |
| 570: | Computer system |
| 575 | Processor |
| 576 | Memory |
| 580 | Data analysis module |
| 585 | Controller module |

The present invention may be characterized by the following points:

1. A method for determining the sheet resistance and current leakage density of a shallow implant in the surface of a semiconductor substrate, the method comprising:

a. Making one or more four-point resistance measurements on said semiconductor surface at a plurality of electrode spacing sets, the induced current in said four-point resistance measurements being below 100 and for at least one of said plurality of electrode spacing sets having an average electrode separation below 100 p.m.

b. Using a known relation between said one or more four-point resistance measurements and said plurality of electrode spacing sets to extract the sheet resistance of said shallow implant in said semiconductor surface.

2. A method according to point 1, further comprising using a known relation between said one or more four-point resistance measurements and said plurality electrode spacing sets to extract the saturation leakage current density of said shallow implant in said semiconductor surface.

3. A method according to point 2, wherein at least one of said plurality of electrode spacing sets has an average spacing above 300 μm.

4. A method according to point 1, wherein at least one of said plurality of electrode spacing sets has an average spacing below 20 μm, and the limiting behavior of theoretical data is used to determine the sheet resistance of said shallow implant, the limiting theoretical behavior being given by the following formula:

$$R|_{s \to 0} = \frac{\log 2}{2\pi} R_t$$

where R is the measured four-point resistance, s is the four-point probe electrode spacing, and $R_t$ is the sheet resistance of said shallow implant.

5. A method according to point 3, wherein sheet resistance and saturation leakage current density of said shallow implant are determined by adjusting the plurality of variables until the theoretical data fit the measured data within a predetermined error, the theoretical and measured data being fit by using the following formula:

$$R = \frac{R_t R_b}{R_t + R_b} \frac{1}{2\pi} \left( \frac{2R_t}{R_b} \left( K_0\left(\frac{s}{\lambda}\right) - K_0\left(\frac{2s}{\lambda}\right) \right) + \log 4 \right)$$

where $\lambda = kT/(J_s q(R_t + R_b))$; $R_t$ and $R_b$ are the sheet resistance of said shallow implant and said semiconductor substrate, respectively, $K_0$ is the modified Bessel function of the second kind of order zero, s is the four-point probe electrode spacing, k is the Boltzmann constant, T is the temperature, $J_s$ is the saturation leakage current density, and q is the elementary charge.

6. A method according to point 5, wherein the electrical resistivity, ρ, of said semiconductor substrate is measured experimentally by Secondary Ion Mass Spectrometry or another method known to those skilled in the art, and the substrate sheet resistance is determined by the relation $R_b = \rho/t$, t being the thickness of said semiconductor substrate.

7. A system for measuring the sheet resistance and saturation leakage current on a shallow implant in a semiconductor substrate, the system comprising:

a. A probe with a plurality of electrodes in contact with the surface of said semiconductor substrate;

b. A voltage controlled current source for inducing a current between a pair of selected electrodes;

c. A high-impedance electrometer for measuring a voltage difference between a pair of selected electrodes;

d. A multiplexer comprising a plurality of electrical connection lines, two of which are connected to said current source and another two of which are connected to said electrometer;

e. A lock-in amplifier for generating a periodic reference signal controlling said voltage controlled current source, and for detecting the in-phase output of said high-impedance electrometer;

f. A computer system with a central processing unit and memory containing program instructions for: Making one or more four-point resistance measurements on said semiconductor surface at a plurality of electrode spacing sets, the induced current in said four-point resistance measurements being below 100 μA, and for at least one of said plurality of electrode spacing sets having and average electrode separation below 100 μm; Using a known relation between said one or more four-point resistance measurements and said plurality of electrode spacing sets to extract the sheet resistance of said shallow implant in said semiconductor surface; Using a known relation between said one or more four-point resistance measurements and said plurality of electrode spacing sets to extract the saturation leakage current density of said shallow implant in said semiconductor surface.

The invention claimed is:

1. A method for determining at least one electrical property of a shallow implant in the surface of a semiconductor substrate, the method comprising the steps of:
providing a multi-point probe having at least four electrically conductive electrodes, each two of said electrodes being separated from each other by an electrode spacing, wherein at least one of the electrode spacings is less than 100 μm;
positioning said electrodes of said multi-point probe in contact with an area of said shallow implant;
performing a four point resistance measurement by inducing a current of less than 100 μA in said area via said multi-point probe; and
extracting at least one electrical property of the shallow implant based on a mathematical relation between said four-point resistance measurement and the electrode spacing between each two of said electrically conductive electrodes.

2. The method according to claim 1, wherein the at least one electrical property extracted in the extracting step includes saturation leakage current density of said shallow implant.

3. The method according to the claim 2, wherein the at least one electrical property extracted in the extracting step further includes sheet resistance of the shallow implant, wherein at least one of the electrode spacings is less than 20 μm, and wherein a limiting behavior of theoretical data is used to determine the sheet resistance of said shallow implant, the limiting theoretical behavior being given by a first formula defined as $$R|_{s \to 0} = \frac{\log 2}{2\pi} R_t$$

where R is the measured four-point resistance, s is the electrode spacing, and $R_t$ is the sheet resistance of said shallow implant.

4. The method according to claim 3, wherein the sheet resistance and saturation leakage current density of said shallow implant are determined by adjusting a plurality of variables until the theoretical data fit measured data within a predetermined error, the theoretical and measured data being fit being achieved by using a second formula defined as $$R = \frac{R_t R_b}{R_t + R_b} \frac{1}{2\pi} \left( \frac{2R_t}{R_b} \left( K_0\left(\frac{s}{\lambda}\right) - K_0\left(\frac{2s}{\lambda}\right) \right) + \log 4 \right)$$

where $\lambda = kT/(J_s q(R_t+R_b))$; $R_t$ and $R_b$ is the sheet resistance of said shallow implant and said semiconductor substrate, respectively; $K_0$ is the modified Bessel function of the second kind of order zero; s is the four-point probe electrode spacing; k is the Boltzmann constant; T is the temperature; $J_s$ is the saturation leakage current density; and q is the elementary charge.

5. The method according to claim 4, wherein said semiconductor substrate has an electrical resistivity ρ, and wherein the method further comprises the step of measuring the resistivity experimentally, whereby the substrate sheet resistance is determined by the relation $R_b = \rho/t$, t being the thickness of said semiconductor substrate.

6. The method according to claim 1, wherein at least one of said electrode spacings is greater than 300 μm.

7. A system for measuring the sheet resistance and saturation leakage current density of a shallow implant in a semiconductor substrate, said system comprising:
   a probe with a plurality of electrodes configured to establish electrical contact with a surface of said semiconductor substrate, each two of the electrodes being separated from each other by an electrode spacing;
   a voltage controlled current source operable to induce a current between a first selected pair of said plurality of electrodes;
   a high-impedance electrometer operable to measure a voltage difference between a second selected pair of said plurality of electrodes;
   a multiplexer comprising a plurality of electrical connection lines, two of which are connected to said current source and another two of which are connected to said electrometer;
   a lock-in amplifier configured and operable to generate a periodic reference signal controlling said voltage controlled current source, and to detect the in-phase output of said high-impedance electrometer; and
   a computer system with a central processing unit and memory comprising code under the control of which the computer system is operable to perform computer implementation of the steps of:
      positioning said electrodes of said in contact with the surface of the semiconductor substrate;
      performing a four point resistance measurement by inducing a current of less than 100 μA in said substrate with said probe; and
      extracting the values of the sheet resistance and the saturation leakage current density of the shallow implant based on a mathematical relation between said four-point resistance measurement and the electrode spacing between each two of said electrodes.

8. The system of claim 7, wherein at least one of said electrode spacings is greater than 300 μm.

9. The system of claim 7, wherein at least one of said electrode spacings is less than 20 μm, and wherein the computer system is operable to use a limiting behavior of theoretical data to determine the sheet resistance of said shallow implant, the limiting theoretical behavior being given by a first formula defined as $$R|_{s \to 0} = \frac{\log 2}{2\pi} R_t$$

where R is the measured four-point resistance, s is the electrode spacing, and $R_t$ is the sheet resistance of said shallow implant.

10. The system of claim 9, wherein the computer system is operable to determine the sheet resistance and saturation leakage current density of said shallow implant by adjusting a plurality of variables until the theoretical data fit measured data within a predetermined error, the theoretical and measured data being fit being achieved by using a second formula defined as $$R = \frac{R_t R_b}{R_t + R_b} \frac{1}{2\pi} \left( \frac{2R_t}{R_b} \left( K_0\left(\frac{s}{\lambda}\right) - K_0\left(\frac{2s}{\lambda}\right) \right) + \log 4 \right)$$

where $\lambda = kT/(J_s q(R_t+R_b))$; $R_t$ and $R_b$ are the sheet resistance of said shallow implant and said semiconductor substrate, respectively; $K_0$ is the modified Bessel function of the second kind of order zero; s is the four-point probe electrode spacing; k is the Boltzmann constant, T is the temperature; $J_s$ is the saturation leakage current density; and q is the elementary charge.

11. The system of claim 10, wherein said semiconductor substrate has an electrical resistivity ρ, and wherein the computer system is operable to determine the sheet resistance by the relation $R_b = \rho/t$, t being the thickness of said semiconductor substrate.

12. The system of claim 7, wherein said first selected pair of electrodes and said second selected pair of electrodes do not include common electrodes.

13. The system of claim 7, wherein the number of electrodes in said plurality of electrodes is four.

14. A method for determining at least one of the sheet resistance and saturation current leakage density of a shallow implant in a semiconductor substrate surface, the method comprising:
   (a) defining on said substrate surface a plurality of electrode contact points, each two of the electrode contact points defining one of a plurality of electrode spacing sets, each of said plurality of electrode spacing sets defining an electrode contact point separation distance;
   (b) performing a four-point resistance measurement on said semiconductor substrate surface at each of said plurality of electrode spacing sets, wherein an induced current in said four-point resistance measurement is below 100 μA, and wherein at least one of said plurality of electrode spacing sets defines an electrode contact point separation distance of less than 100 μm; and
   (c) extracting at least one of the sheet resistance and saturation leakage current density of said shallow implant based on a mathematical relation between said four-point resistance measurements and said plurality of electrode spacing sets.

15. The method according to claim 14, wherein at least one of said plurality of electrode spacing sets defines electrode contact point separation distance greater than 300 μm.

16. The method according to claims 14, wherein at least one of said plurality of electrode spacing sets defines an electrode contact point separation distance of less than 20 μm, and wherein limiting behavior of theoretical data is used to determine the sheet resistance of said shallow implant, the limiting theoretical behavior being given by a first formula defined as $$R|_{s \to 0} = \frac{\log 2}{2\pi} R_t$$

where R is the measured four-point resistance, s is the four-point probe electrode spacing, and $R_t$ is the sheet resistance of said shallow implant.

17. The method according to claim 14, wherein the sheet resistance and saturation leakage current density of said shallow implant are determined by adjusting a plurality of variables until the theoretical data fit the measured data within a predetermined error, the theoretical and measured data being fit being achieved by using a second formula defined as $$R = \frac{R_t R_b}{R_t + R_b} \frac{1}{2\pi} \left( \frac{2R_t}{R_b} \left( K_0\left(\frac{s}{\lambda}\right) - K_0\left(\frac{2s}{\lambda}\right) \right) + \log 4 \right)$$

where $\lambda = kT/(J_s q(R_t + R_b))$; $R_t$ and $R_b$ are the sheet resistance of said shallow implant and said semiconductor substrate, respectively; $K_0$ is the modified Bessel function of the second kind of order zero; s is the four-point probe electrode spacing; k is the Boltzmann constant; T is the temperature; $J_s$ is the saturation leakage current density; and q is the elementary charge.

18. The method according to claim 14, wherein said semiconductor substrate has an electrical resistivity $\rho$, and wherein the method further comprises the step of measuring the resistivity experimentally, whereby the substrate sheet resistance is determined by the relation $R_b = \rho/t$, t being the thickness of said semiconductor substrate.

* * * * *